United States Patent [19]

Sugawara

[11] Patent Number: 5,136,602
[45] Date of Patent: Aug. 4, 1992

[54] OPTICAL SEMICONDUCTOR DEVICE

[75] Inventor: Mitsuru Sugawara, Sagamihara, Japan

[73] Assignee: Fujitsu Limited, Kawasaki, Japan

[21] Appl. No.: 587,686

[22] Filed: Sep. 25, 1990

[30] Foreign Application Priority Data

Sep. 26, 1989 [JP] Japan .................................. 1-249814
Mar. 20, 1990 [JP] Japan .................................. 2-70009

[51] Int. Cl.$^5$ .................................................. H01S 3/19
[52] U.S. Cl. .......................................... 372/45; 357/4; 357/16; 357/17
[58] Field of Search ................... 357/4, 16, 17, 30 E; 372/45, 43, 44; 250/211 J, 213 A

[56] References Cited

U.S. PATENT DOCUMENTS

| Re. 22,893 | 3/1989 | Miller ................................ 250/211 J |
| 4,897,699 | 1/1990 | Razeghi et al. ....................... 357/4 |
| 4,927,471 | 5/1990 | Okuda .............................. 148/33.5 |
| 4,929,984 | 5/1990 | Muto et al. ........................... 357/4 |
| 4,941,025 | 7/1990 | Tabatabaie .......................... 357/16 |
| 4,952,792 | 8/1990 | Caridi .............................. 250/211 J |
| 4,984,242 | 1/1991 | Scifres et al. ....................... 372/45 |

OTHER PUBLICATIONS

Songcheol Hong et al., Effect of the Lifting of Kramer's Degeneracy on Excitonic Linewidths in Quantum Well Optical Modulators, Aug. 29, 1988, vol. 53, No. 9, pp. 731-733, New York, U.S.
D. R. P. Guy et al., Experimental Study of InGaAs-InP MQW Electroabsorption Modulators, Feb. 1989, vol.136, No. 1, pp. 46-51.
U. Koren et al., InGaAs/InP Multiple Quantum Well Waveguide Phase Modulator, Feb. 16, 1987, vol. 50, No. 7, pp. 368-370, p. 368, right column, line 7-line 26, FIG. 1, New York, U.S.
K. Wakita et al., Dynamic Frequency Response for InGaAs/InAlAs Multiple Quantum Well Optical Modulators, Jan. 1989, vol. 1, No. 1, pp. 19-20, New York, U.S.
D. A. B. Miller, Quantum Wells for Optical Information Processing, May 1987, vol. 26, No. 5, pp. 368-372, New Jersey, U.S.
M. Sugawara et al., Evaluation of Exciton Absorption Peak Broadening Factors in InGaAsP/InP, Sep. 11, 1988, pp. 309-312, Atlanta, U.S.

*Primary Examiner*—Georgia Y. Epps
*Attorney, Agent, or Firm*—Staas & Halsey

[57] ABSTRACT

An InP p-n diode having an MQW consisting of an InP barrier layer and an $In_{1-x}Ga_xAs$ well layer as an active layer. An optical modulating diode in which a composition of a value 0.44 which is smaller than the x value 0.47 at which lattices are matched is selected so as to cause compressive strain in the well layer, and an optical bistable diode in which a composition of a value 0.55 which is greater than 0.47 is selected so as to cause tensile strain in the well layer.

7 Claims, 9 Drawing Sheets

OPTICAL ABSORPTION COEFF. [cm⁻¹]

WAVE LENGTH [μm]

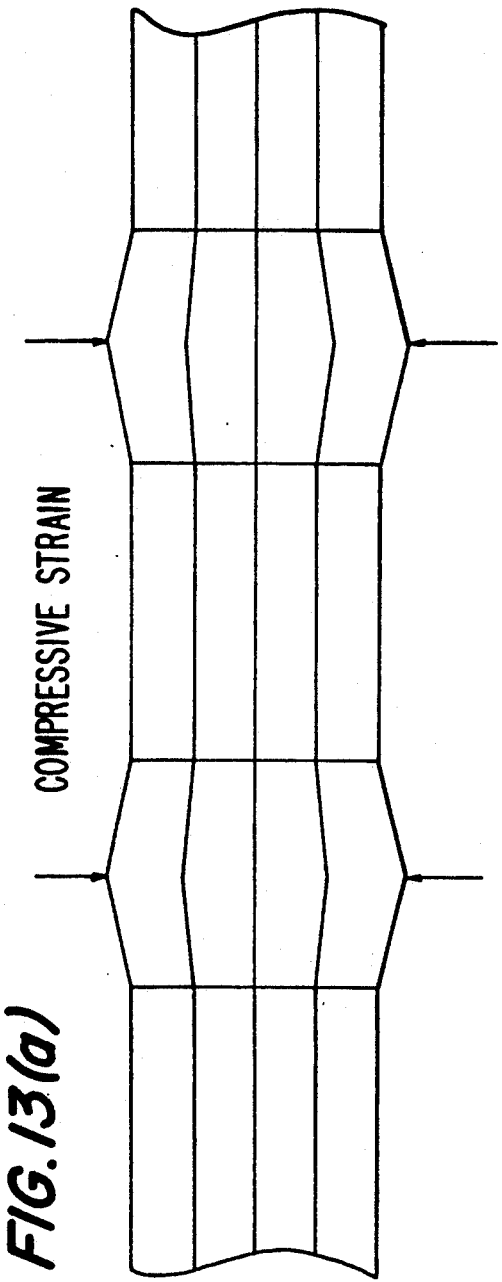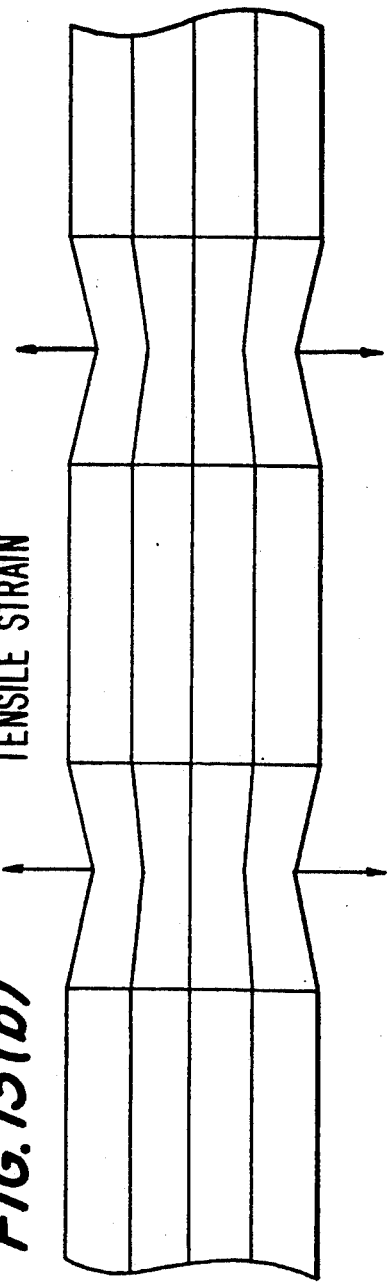
FIG. 13(a) COMPRESSIVE STRAIN
FIG. 13(b) TENSILE STRAIN

OPTICAL SEMICONDUCTOR DEVICE

BACKGROUND OF THE INVENTION

1. Field of the Invention

The present invention relates to an optical semiconductor device and, in particular, to an optical semiconductor device having a quantum well structure.

The technology of so-called band engineering regarding a quantum well structure made up of III-V compound semiconductor thin layers, super lattices, strained lattices or the like have been developed considerably. Optical devices such as lasers, optical sensing devices, optical modulating devices, and the like, in which band engineering is applied, have recently come into practical use.

2. Description of the Related Art

Regarding a structure in which there are two types of semiconductor layer, i.e., a barrier layer 42 and a well layer 44 shown in FIG. 1(a), an energy band diagram of this structure is shown in FIG. 1(b). That is, a quantum well 48 which corresponds to the well layer 44 is sandwiched between barrier layers 46 of valence and conduction bands corresponding to the barrier layer 42, and well-type potential continues. When the width $L_w$ of this well is as small as several 10 nm, the motion of the electrons and holes inside the well layer 44 in the z direction is limited, and respective energy levels are quantized. A well in such state is called a quantum well (QW), and a plurality of such wells when connected are called a multi-quantum well (MQW).

In the optical absorption spectrum of a bulk semiconductor material, generally, a sharp absorption peak is observed in the vicinity of the absorption edge at low temperatures. This absorption peak is due to an absorption caused by an exciton in which an electron and a hole are combined with each other by the Coulomb force. In a model of an exciton in which an electron is distributed spherically around a hole, its diameter is determined by the reduced effective mass of the exciton and the static dielectric constant of a semiconductor material, and is usually 20 to 40 nm.

When an exciton is produced in the quantum well 48, the bonding energy increases since the exciton is compressed in a direction perpendicular to the well layer 44, thus causing an increase in the oscillator strength of the exciton, i.e., the strength of optical absorption. A clear optical absorption peak is observed even at room temperature. An actually observed optical absorption spectrum is schematically shown in FIG. 2.

In FIG. 2, an absorption peak due to an exciton associated with an electron and a heavy hole is observed in the portion indicated by the letter A, and an absorption peak due to an exciton associated with an electron and a light hole is observed in the portion indicated by the letter B.

A quantum well having such optical characteristics is utilized in optical devices such as optical modulators, optical bistable devices, and optical switches.

A conventional optical modulator is a diode formed by an arrangement in which an active layer 50 formed from a MQW, in which the barrier layer 42 and the well layer 44 are laminated, is interposed between a p-type semiconductor 52 and an n-type semiconductor 54, as shown in FIG. 1(c). For the p-type semiconductor 52 and the n-type semiconductor 54, InP, etc. is used. The energy band diagram of this diode is the same as that shown in FIG. 1(b). When a reverse bias is applied to this diode, the energy band diagram varies as shown in FIG. 1(d). That is, the energy level of the quantized electrons and holes in the quantum well 48 sandwiched by barrier walls 46 are decreased. For this reason, the optical absorption spectrum is shown by the spectrum indicated by the broken line in FIG. 2. The absorption peak due to an exciton associated with an electron and a hole shifts several 10 meV toward the long wavelength side, i.e., a low energy side. This is called an electric-field on state.

Suppose that the light emission wavelength $\lambda_{L1}$ of a semiconductor laser has been set to a position indicated by an arrow in FIG. 2, i.e., to the optical absorption peak A' of an exciton near the absorption edge in the electric-field on state. Optical modulation can be performed by causing this laser beam to enter the MQW active layer 50 of an optical modulator in which the electric field is turned on and off. That is, a laser beam is emitted from the MQW active layer 50 at a light intensity of $I_{OFF}$, scarcely being absorbed in the off state. In the on state, however, the laser beam is absorbed in the quantum well 48 of the MQW active layer 50, and a light intensity $I_{ON}$ at which light is emitted to outside is small. The intensity ratio $\eta$ ($=I_{ON}/I_{OFF}$) of an emission laser beam which is emitted in correspondence to the on or off state of an electric field should preferably be smaller from the viewpoint of modulation characteristics. For that purpose, the strength of optical absorption due to an exciton should be as large as possible.

A conventional optical bistable device is one called SEED (self electro-optic effect device) in which the diode shown in FIG. 1(c) is connected to a power supply via an external load resistance. In the SEED, an incident beam is made to enter from a p-type semiconductor layer and an emission beam is caused to be emitted from an n-type semiconductor layer. Now, a reverse bias is applied to the SEED beforehand, and the wavelength $\lambda_{L2}$ of the incident beam is set to the wavelength of an exciton absorption A in the electric-field off state. This incident beam is absorbed in the quantum well 48 of the MQW active layer 50, and a photoelectric current flows in the SEED at almost 100% efficiency. As a result, the reverse bias voltage applied to the diode is decreased, and the optical absorption spectrum shown in FIG. 2 nears the solid line, i.e., the electric-field off state. Therefore, an optical absorption coefficient with respect to the incident beam is increased, thus causing a photoelectric current to increase and causing the reverse bias voltage to further decrease. As the result of the occurrence of such a positive feedback, optical bistable characteristics can be observed between the incident beam and the emission beam. The width of this bistable area depends on the ratio of the absorption coefficient of the exciton absorption A indicated by the solid line in FIG. 2 to the absorption coefficient of the spectra indicated by the broken line corresponding to the wavelength $\lambda_{L2}$ of the incident beam. The larger the ratio, the wider the bistable area.

FIG. 3 explains an example of an optical switch using a diode having an MQW 60 as in FIG. 1(c). An n-type InP layer 63 and a p-type InP island 62 are formed on an n-type InP substrate 64 via the MQW 60. Further, an X waveguide 61 of an n-type InP layer is disposed with the p-type InP island 62 in the middle. The black section of the upper section of the figure denotes an electrode. An incident beam I propagates the waveguide and travels straight as a transmission beam T in a case where an electric field is not applied to the MQW. Conversely, when an electric field is applied to the MQW, since the exciton absorption peak shifts toward the long wavelength side, the index of refraction varies. As a result, the incident beam travels another waveguide as a refraction beam R. The stronger absorption intensity by the exciton, the larger the variation in the index of refraction, and therefore switching characteristics are better.

As described above, the optical absorption strength of an exciton should preferably be larger in optical modulators, in optical bistable devices, and in optical switches. In the case of a III-V compound semiconductor, the optical absorption coefficient of an exciton is $1 \times 10^4 cm^{-1}$ at most at room temperature, and in the case of InGaAs, that is $8 \times 10^3 cm^{-1}$. To obtain excellent characteristics of an optical modulator, the value of the exciton absorption coefficient must be further increased 10% or more. A larger value of the absorption coefficient also has been desired to improve optical bistable device characteristics.

SUMMARY OF THE INVENTION

An object of the present invention is to improve the characteristics of an optical semiconductor device.

Another object of the present invention is to increase the optical absorption strength of an exciton in a III-V compound semiconductor.

The above-mentioned objects can be achieved by using the means described below.

Compressive or tensile strain is introduced into a well layer by providing a difference between the lattice constants of a well layer and a barrier layer forming an MQW structure. The oscillator strength of an exciton is increased by causing the effective mass of a heavy hole inside a quantum will to be larger in order to increase the optical absorption coefficient. After the band of a light hole is positioned above that of a heavy hole, by interchanging the position of the absorption peak due to an exciton associated with an electron and a heavy hole with the position of the absorption peak due to an exciton associated with an electron and a light hole, the ratio of the absorption coefficient due to an exciton near the absorption edge to the absorption coefficient of a low absorption region on the short wavelength side is increased.

The above is realized as follows: an MQW active layer is formed from an $In_{1-x}Ga_xAs$ well layer and an InP barrier layer. The composition x of the $In_{1-x}Ga_xAs$ well layer is made smaller than the composition whose lattices are matched with InP in order to increase its lattice constant, and a layer. Thus, regarding the absorption peak due to an exciton associated with an electron and a heavy hole, an oscillator strength in a wavelength, i.e., optical absorption strength, can be increased. Modulation efficiency is enhanced as the result of the production of a p-n diode light modulator in which such MQW active layer is disposed.

Conversely, the composition x of the $In_{1-x}Ga_xAs$ well layer is made larger than the composition whose lattices are matched with InP in order to decrease its lattice constant, and a tensile strain is introduced into the $In_{1-x}Ga_xAs$ well layer. Thus, the shift of the absorption peak due to an exciton associated with an electron and a light hole to the long wavelength side of the absorption peak wavelength due to an exciton associated with an electron and a heavy hole enables the ratio of the optical absorption coefficient in the optical absorption peak wavelength of an exciton associated with an electron and a heavy hole to the optical absorption coefficient in the low absorption region of the short wavelength side to be increased. Consequently, a wider bistable area, i.e., an optical bistable characteristic which is more stable than has previously been, can be obtained as the result of the production of an optical bistable device having an MQW active layer using such an $In_{1-x}Ga_xAs$ well layer and an InP barrier layer.

These and other objects, features and advantages of the present invention will become clear when reference is made to the following description of the preferred embodiments of the present invention, together with reference to the accompanying drawings.

BRIEF DESCRIPTION OF THE DRAWINGS

FIG. 13(a) and 13(b) show lattice mismatching and resulting strain of an MQW structure.

DESCRIPTION OF THE PREFERRED EMBODIMENTS

Two embodiments of the present invention will be explained hereinunder with reference to FIGS. 4 through 12.

In all the views, like numerals and characters designate like or corresponding parts.

First Embodiment

This is an embodiment in which the present invention is applied to an optical modulator.

FIGS. 4(a) through 5(c) are views for explaining the principles of the present invention.

Figure 1A:
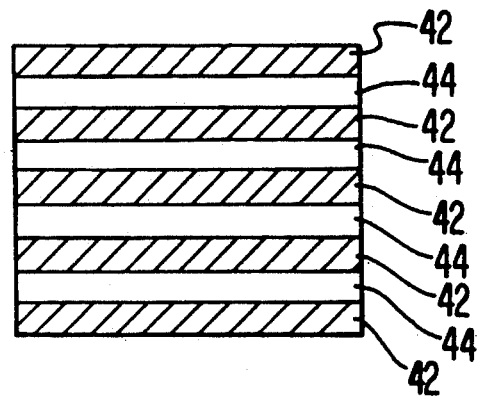
FIG. 1(a) is a cross-sectional schematic view illustrating a structure in which a barrier layer and a well layer are laminated.
Figure 1B:
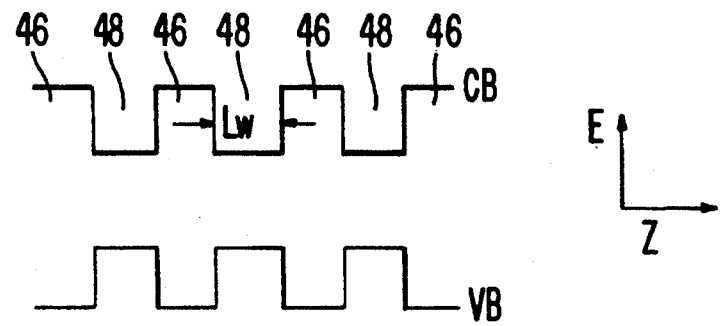
FIG. 1(b) is an energy band which corresponds to the structure in FIG. 1(a)
Figure 2:
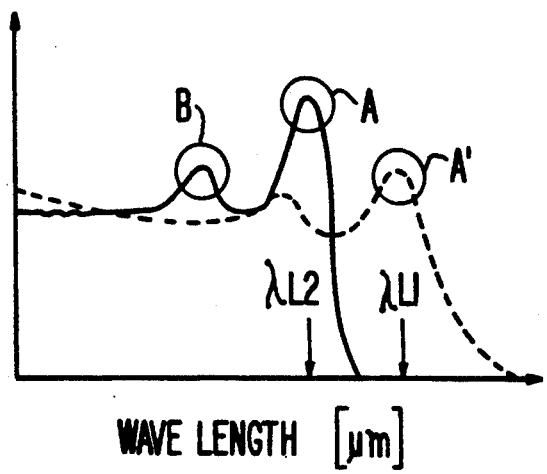
FIG. 2 is a view schematically illustrating an optical absorption spectrum for explaining a conventional optical modulator.
Figure 1C:
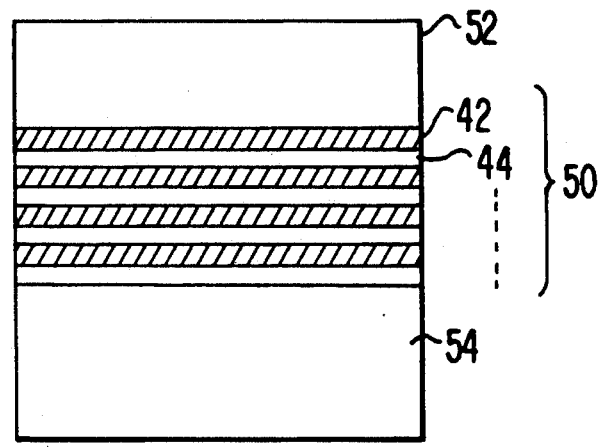
FIG. 1(c) is a cross-sectional schematic view for explaining the conventional optical modulator.
Figure 1D:
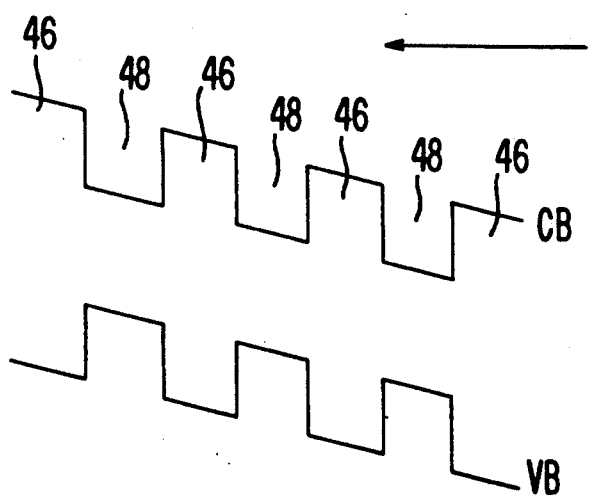
FIG. 1(d) is an energy band diagram in a case where a reverse bias is applied to the diode of FIG. 1(c)
Figure 3:
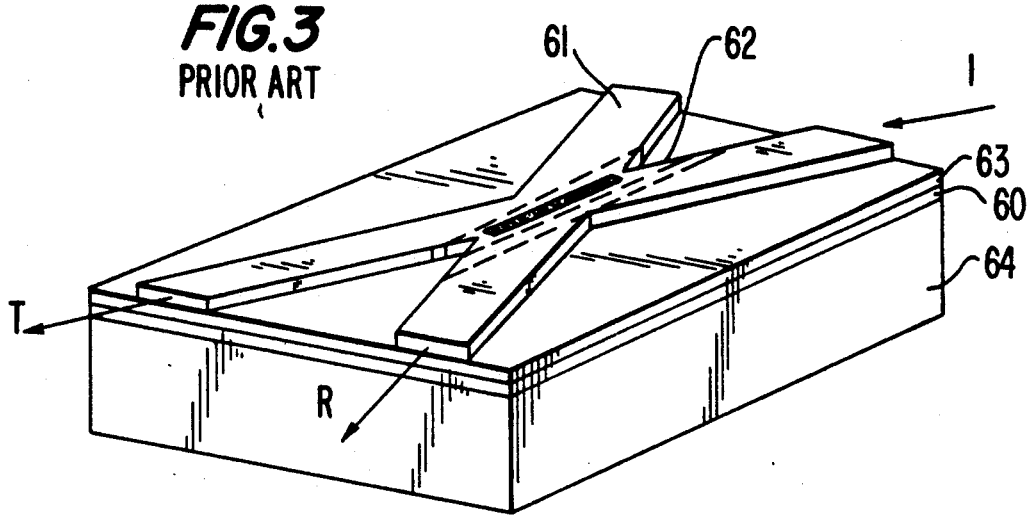
FIG. 3 is a view for explaining a conventional optical switching device.
Figure 4A:
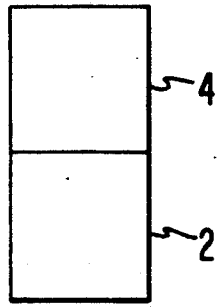
FIG. 4(a) is a schematic view illustrating the crystal lattices of a barrier layer and a well layer in a case where the lattice constant of the barrier layer is equal to that of the well layer.
Figure 4B:
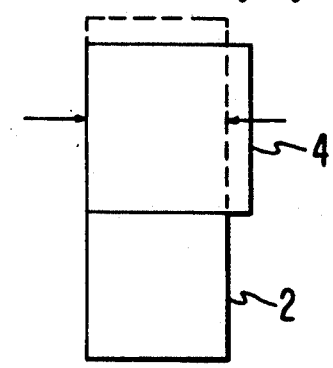
FIG. 4(b) is a schematic view illustrating the crystal lattices of a barrier layer and a well layer in a case where the lattice constant of the well layer is greater than that of the barrier layer.
Figure 4C:
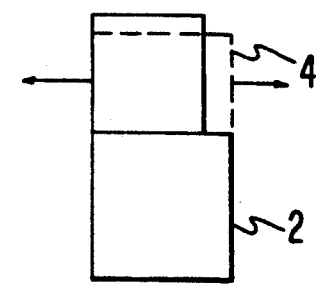
FIG. 4(c) is a schematic view illustrating the crystal lattices of a barrier layer and a well layer in a case where the lattice constant of the well layer is smaller than that of the barrier layer.

FIGS. 4(a) to 4(c) are schematic views illustrating the crystal lattices of two types of laminated semiconductor layers (a barrier layer 2 and a well layer 4). FIGS. 4(a) to 4(c) are schematic views illustrating the band structure of the quantum wells which correspond to the crystal lattices of FIGS. 4(a) to 4(c).

Figure 5C:
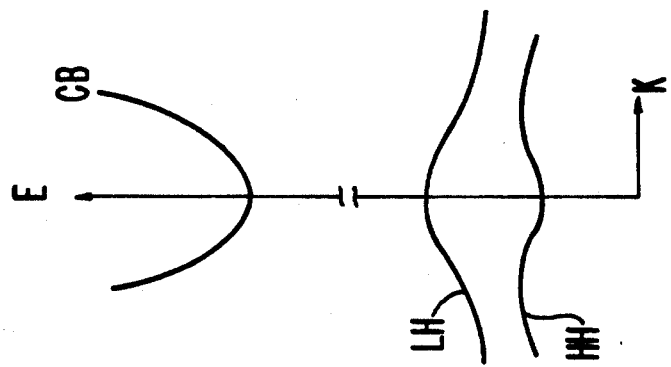
FIG. 5(c) is an E-K curb of an well layer having tensile strain.

In FIG. 4(a), the lattice constants of the barrier layer 2 and the well layer 4 are equal to each other, which indicates that their lattices are matched. FIG. 5(a) is an E-K curb in a direction of the in-plane of the quantum well of the well layer 4. In FIG. 5, the conduction band CB is almost parabolic. In the valence band, the band HH of a heavy hole and the band LH of a light hole are splitted at $K=0$; at $K>0$, the band HH of the heavy hole is positioned above the band LH of the light hole. FIG. 4(b) shows a case where the lattice constant of the well layer 4 is greater than that of the barrier layer 2. In this case, as shown by the broken line, a compressive strain occurs in the well layer 4 so as to cause the lattice constant of the in-plane in contact with the barrier layer 2 to be in agreement with that of the well layer 4. In the E-K curb of the well layer 4 having such a strain, as shown in FIG. 5(b), the position of the band of a hole moves at the point $K=0$, and an energy difference ($\Delta E$) between the band HH of the heavy hole and the band LH of the light hole becomes greater.

FIG. 4(c) shows a case where the lattice constant of the well layer 4 is smaller than that of the barrier layer 2. In this case, as shown by the broken line, a tensile strain occurs in the well layer 4 so as to cause the lattice constant of the in-plane in contact with the barrier layer 2 to be in agreement with that of the well layer 4. In the E-K curb of the well layer 4 having such a strain, the position of the band of a hole moves at the point $K=0$, and the $\Delta E$ becomes smaller. Depending upon the magnitude of a tensile strain which occurs in the well layer 4, the band LH of the light hole is positioned above the band HH of the heavy hole, as in the E-K curb shown in FIG. 5(c). As a result, in the optical absorption spectrum, the position of the absorption peak due to an exciton associated with an electron and a heavy hole is interchanged with the position of the absorption peak due to an exciton associated with an electron and a light hole.

Figure 5B:
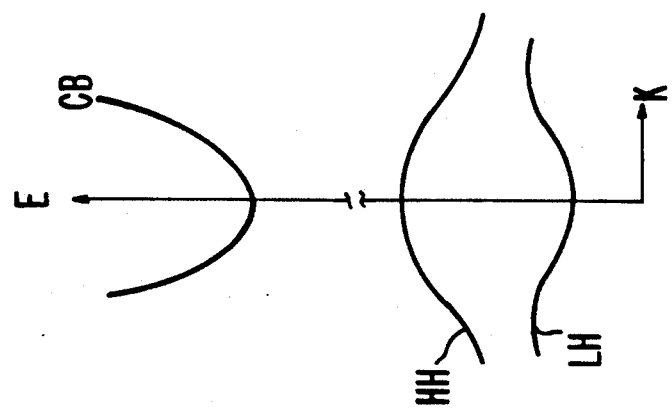
FIG. 5(b) is an E-K curb of an well layer having compressive strain.
Figure 5A:
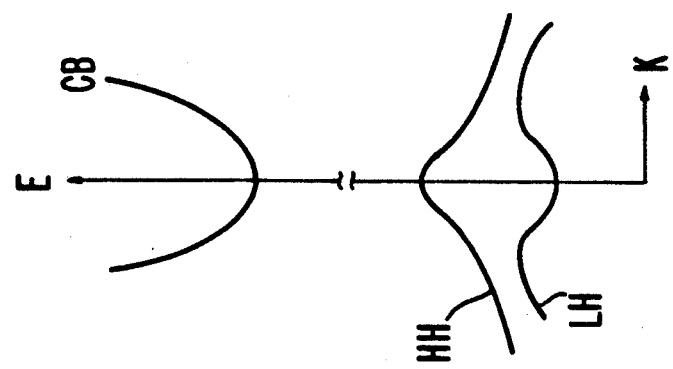
FIG. 5(a) is an energy wave number (E-K) curb in the direction of the in-plane of the quantum well of the well layer.

Since the effect of these two types of strains causes the magnitude of the interaction between the band HH of the heavy hole and the band LH of the light hole to vary, the shapes of the bands themselves vary, as shown in FIG. 5(b). How the shape of a band varies depending on the sense and magnitude of a strain is determined by the properties of the material from which a quantum well is formed.

Meanwhile, the fact that the oscillator strength of an exciton depends on the shape of a band in the vicinity of $K=0$ is known from quantum mechanics. That is, in the case of an upward convex as the band HH of the heavy hole, the smaller (i.e., the greater the effective mass) the absolute value of a rate of change with respect to the wave number K of an energy E, the greater the oscillator strength. Conversely, in the case of a downward convex as the band LH of the light hole, the greater (i.e., the smaller the effective mass) the absolute value of a rate of change with respect to the wave number K of an energy E, the greater the oscillator strength. Therefore, the oscillator strength of an exciton can be increased with a method wherein a strain is intentionally introduced to the well layer 4, and the shape of the band of a hole is optimized.

As shown in FIG. 5(c), where a tensile strain is applied and thus the band LH of the light hole is positioned above the band HH of the heavy hole, the position of the absorption peak due to an exciton associated with an electron and a heavy hole moves to the short wavelength side of the absorption peak due to an exciton associated with an electron and a light hole. As a result, the ratio of the absorption peak due to an exciton associated with an electron and the heavy hole to the absorption coefficient of a low absorption region on a shorter wavelength side than the peak is greater than in a case where no tensile strain is applied.

To utilize the principles described above, the laminated structure of an InGaAs well layer and an InP barrier layer is produced. It is confirmed that the oscillator strength of an exciton is increased and the ratio of an absorption peak due to an exciton associated with an electron and a heavy hole to the absorption coefficient of a low absorption region on a shorter wavelength side than the peak is increased with the lamination of the structure. Absorption intensity due to an exciton becomes large as the width of the well decreases.

On the contrary, the amount of shift of the absorption peak due to an exciton during an electric field is applied, becomes large as the width of the well increases.

From the standpoint of device application, an adequate width is between 5 and 15 nm, and 10 nm is considered to be most preferable.

Figure 6:
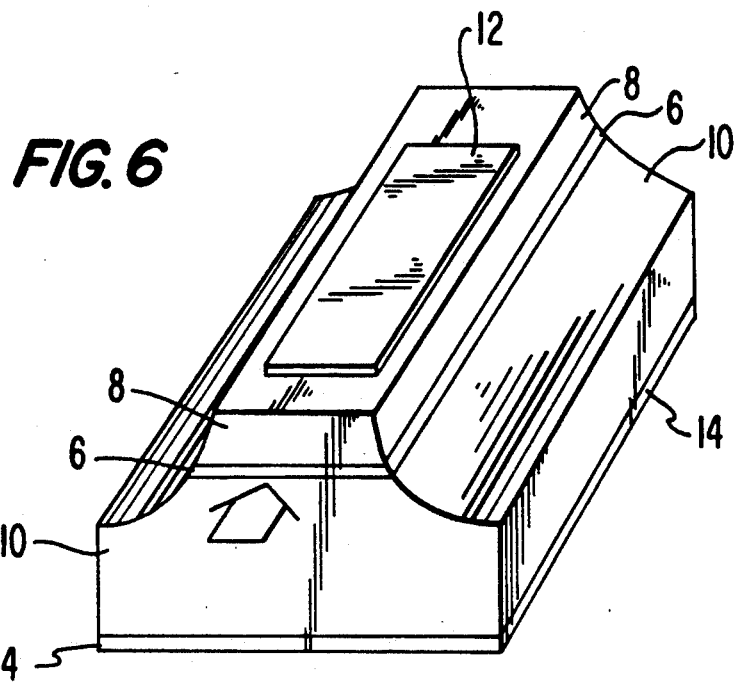
FIG. 6 is a perspective view illustrating an optical modulator in a first embodiment.

FIG. 6 is a perspective view illustrating an optical modulator in the first embodiment. In the optical modulator shown in FIG. 6, a laser beam of a wavelength $\lambda_L$ is incident on an MQW active layer 6 interposed between a p-type InP 8 and an n-type InP 10 in the direction shown (in parallel to the MQW plane). A p-side electrode 12 and an n-side electrode 14 are disposed on the top surface of the p-type InP 8 and the bottom surface of the n-type InP 10, respectively. The MQW active layer 6 is formed from a lamination structure in which the $In_{1-x}Ga_xAs$ well layer and an InP barrier layer are laminated. The thickness of the $In_{1-x}Ga_xAs$ well layer is 10 nm. The value x representing the composition of the $In_{1-x}Ga_xAs$ well layer is set at 0.44, which is chosen to be smaller than the x value 0.47 of a composition at which the lattice of the $In_{1-x}Ga_xAs$ well layer is matched with that of the InP barrier layer, so that the lattice constant of the $In_{1-x}Ga_xAs$ well layer is greater than that of the InP barrier layer. As a result, a compressive strain is introduced into the $In_{0.56}Ga_{0.44}As$ well layer.

Figure 7A:
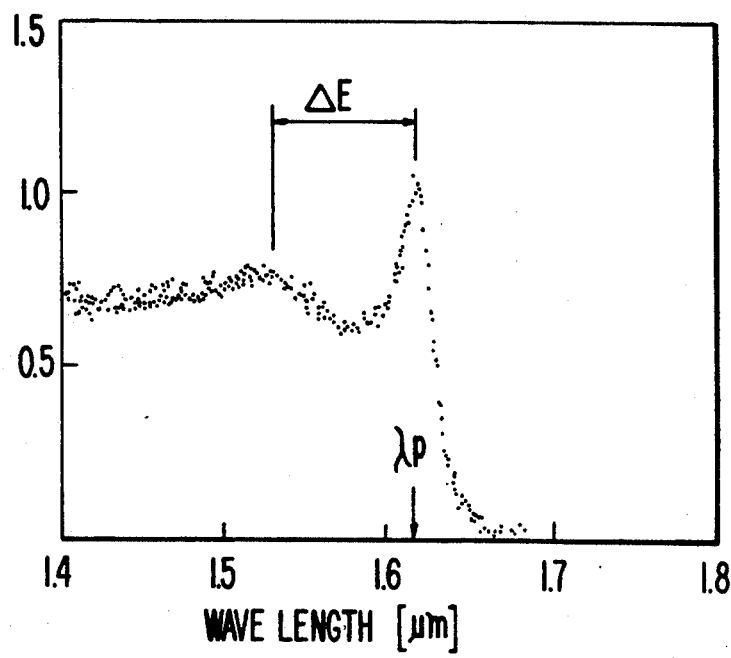
FIG. 7(a) is a view showing an optical absorption spectrum of an MQW active layer 6 consisting of a lamination structure of an $In_{0.56}Ga_{0.44}As$ well layer and an InP barrier layer at room temperature.
Figure 7B:
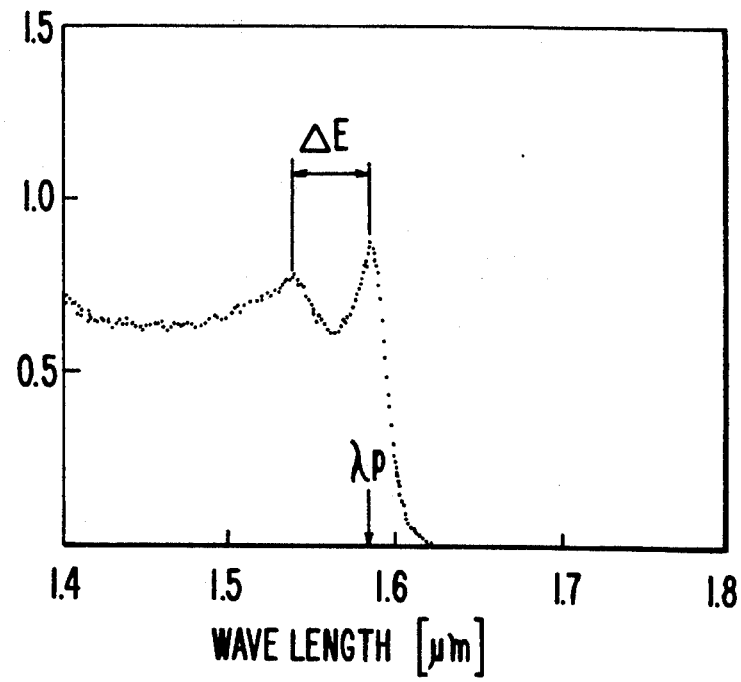
FIG. 7(b) is a view showing an optical absorption spectrum of an MQW active layer 6 consisting of a lamination structure of an $In_{0.53}Ga_{0.47}As$ well layer and an InP barrier layer at room temperature.

FIG. 7(a) shows the optical absorption spectrum of an MQW active layer 6 consisting of a lamination structure of an $In_{0.56}Ga_{0.44}As$ well layer and an InP barrier layer at room temperature. FIG. 7(b) shows, for comparison, the optical absorption spectrum of an MQW active layer 6 consisting of a lamination structure of an $In_{0.53}Ga_{0.47}$ well layer and an InP barrier layer at room temperature, in which the lattice of the $In_{1-x}Ga_xAs$ well layer is matched with that of the InP barrier layer.

As is apparent from a comparison of FIG. 7(a) with FIG. 7(b), the optical absorption peak wavelength $\lambda_P$ due to an exciton associated with an electron and a heavy hole in $In_{0.56}Ga_{0.44}As$ well shifts toward the long wavelength side, and the peak value at the wavelength $\lambda_P$ is greater. For this reason, an exciton peak region representing the oscillator strength of an exciton is greater. In addition, it is confirmed that the $\Delta E$ corresponding to a difference between an optical absorption peak due to an exciton associated with an electron and a heavy hole and an optical absorption peak due to an exciton associated with an electron and a light hole is greater.

Figure 8:
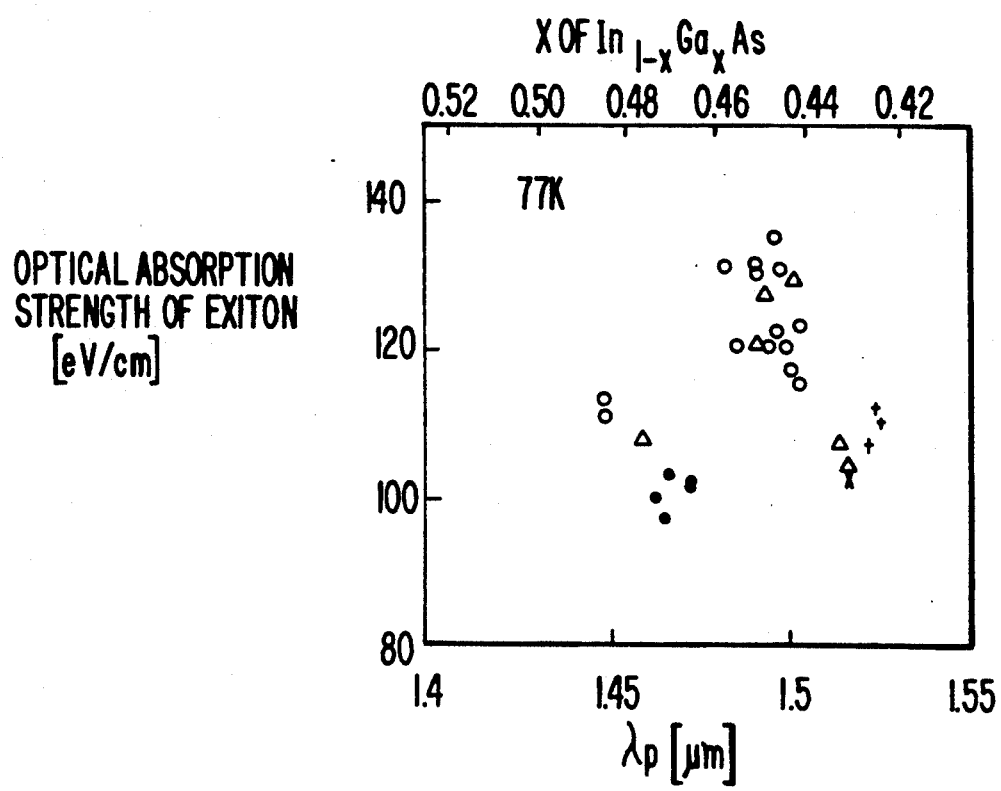
FIG. 8 is a graph in which is plotted the relation between an exciton optical absorption intensity and an absorption peak wavelength $\lambda_P$ at temperature 77 K with respect to several $In_{1-x}Ga_xAs$ well layers having different composition x.

Next, to make clear how the optical absorption strength of an exciton associated with an electron and a heavy hole varies with the variation in the composition x of the $In_{1-x}Ga_xAs$ well layer, the results of the measurement of the variation in the exciton optical absorption strength when the value of the composition x varies in a direction in which it becomes smaller are shown in FIG. 8. FIG. 8 is a graph in which is plotted the relation between an exciton optical absorption intensity and the absorption peak wavelength $\lambda_P$ of an exciton at temperature 77 K with respect to several $In_{1-x}Ga_xAs$ well layers having different composition x. In FIG. 8, it can be seen that the exciton optical absorption strength when the composition x is 0.47 is 100 to 110 ev/cm; when the composition x is between 0.43 and 0.46, the exciton optical absorption strength is between 120 and 130 eV/cm, which is an increase of 20 to 30% in comparison with the case of x=0.47.

Therefore, when the wavelength $\lambda_L$ of a laser beam incident on the MQW active layer 6 of an optical modulator shown in FIG. 6 is set to the optical absorption peak wavelength $\lambda_P$ of an optical absorption peak due to an exciton associated with an electron and a heavy hole in FIG. 7(a), the laser beam intensity ratio $\eta(=ION/IOFF)$ in Correspondence to the on or off state of an electric field can be made smaller than in a case where the wavelength $\lambda_L$ is set to $\lambda_P$ in FIG. 7(b).

Figure 9:
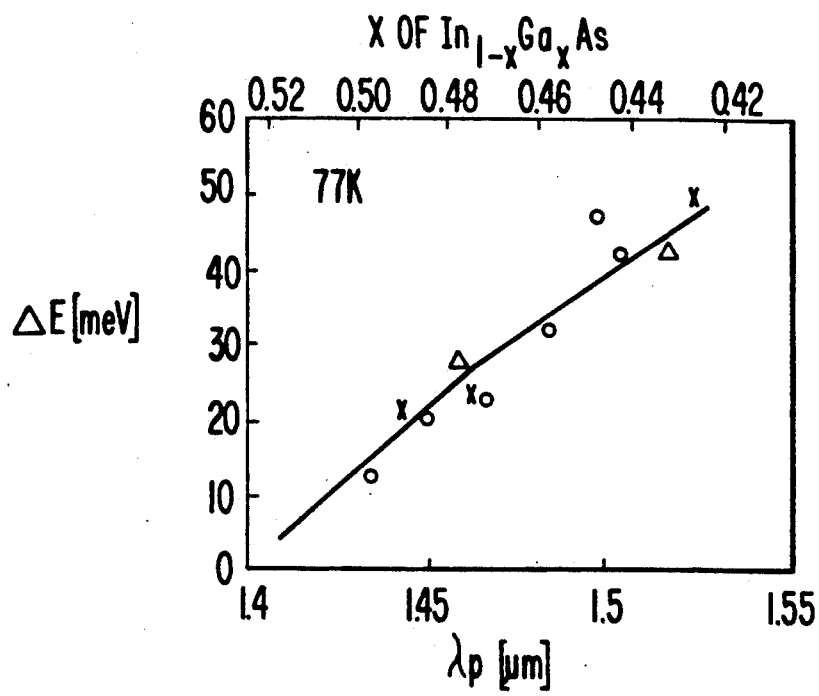
FIG. 9 is a graph in which is plotted the relation between $\Delta E$ and the absorption peak wavelength $\lambda_P$ of an exciton at temperature 77 K with respect to several $In_{1-x}Ga_xAs$ well layers having different composition x.

Next, to make clear how the energy difference $\Delta E$ between an energy corresponding to an optical absorption peak due to an exciton associated with an electron and a heavy hole and an absorption peak due to an exciton associated with an electron and a light hole varies with the variation in the composition x of the $In_{1-x}Ga_xAs$ well layer, $\Delta E$ is measured with respect to an $In_{1-x}Ga_xAs$ well layer of various compositions, the results of which are shown in FIG. 9. FIG. 9 is a graph in which is plotted the relation between $\Delta E$ and the absorption peak wavelength $\lambda_P$ of an exciton at temperature 77 K with respect to an $In_{1-x}Ga_xAs$ well layers having a composition value x of 0.42 to 0.52. In this graph, the solid line denotes the calculated value of $\Delta E$ of the $In_{1-x}Ga_xAs$ well layer with respect to the composition x, the band gap variation and the amount of strain being taken into consideration. As apparent from this figure, the measurement value of $\Delta E$ is quite in agreement with the calculation value. This fact indicates that a strain in accordance with a theory is introduced to the $In_{1-x}Ga_xAs$ well layer in correspondence with the value of the composition x.

In this embodiment, a case is described where the composition x of the $In_{1-x}Ga_xAs$ well layer is made smaller than the composition value at which lattices are matched, and a compressive strain is introduced into the $In_{1-x}Ga_xAs$ well layer. The amount of strain required to increase the effective mass of the band of an electron and a heavy hole to increase the exciton strength and its sense (compressive or tensile) depends on the kind of a material used in the MQW. Consequently, if an amount and sense of strain is controlled in an arbitrary MQW, it is possible to increase the exciton strength.

Second Embodiment

Figure 10:
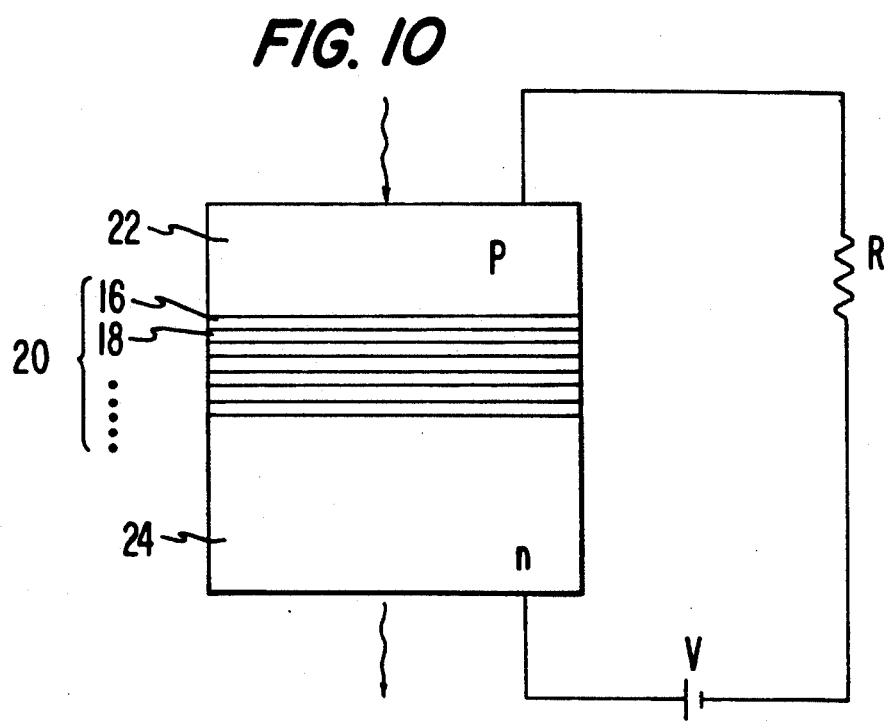
FIG. 10 is a schematic view of a SEED in a second embodiment.

An example in which the present invention is applied to a SEED will be explained. FIG. 10 is a schematic view of the SEED in the second embodiment. An MQW active layer 20 in which an $In_{1-x}Ga_xAs$ well layer 16 and an InP barrier layer 18 are alternately laminated is interposed between a p-type InP layer 22 and an n-type InP layer 24, thus a diode is formed. A power supply V for applying a reverse bias is connected to this diode via an external load resistance R.

The thickness of the $In_{1-x}Ga_xAs$ well layer 16 is 10 nm. The composition x is set at 0.55 so that the lattice constant of the $In_{1-x}Ga_xAs$ well layer 16 is smaller than the lattice constant of the InP barrier layer 18. As a result, a tensile strain is introduced to the $In_{1-x}Ga_xAs$ well layer 16.

An incident beam of a power of $P_{IN}$ is entered from above the p-type InP layer 22, and an emission beam of a power of $P_{OUT}$ is emitted to beneath the n-type InP layer 24.

Figure 11:
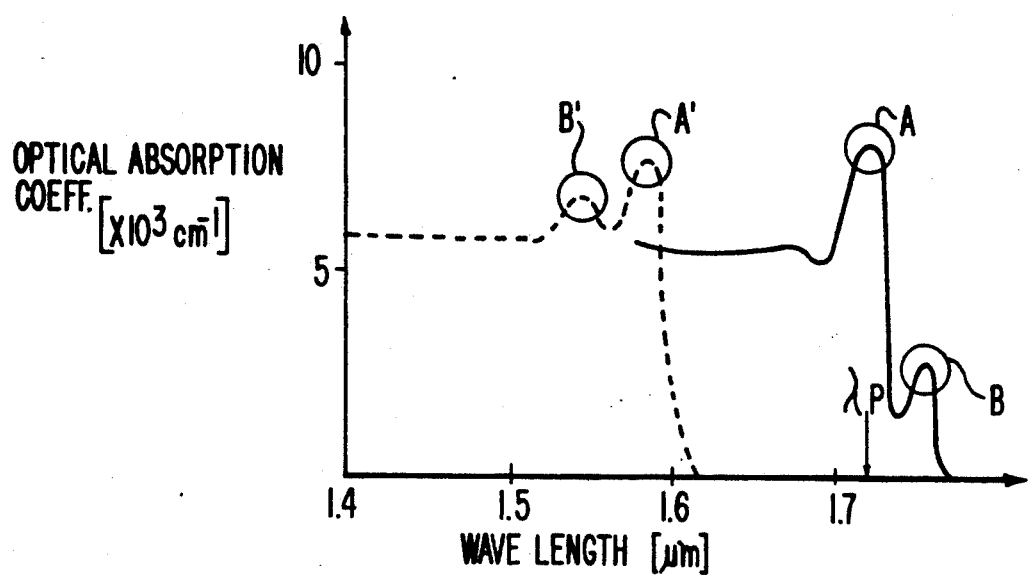
FIG. 11 is a view illustrating the optical absorption spectrum of an MQW constituting the SEED for explaining the characteristics of the SEED of FIG 10.

FIG. 11 shows the optical absorption spectrum of an MQW constituting a SEED of FIG. 10. In FIG. 11, shown by the solid line is an optical absorption spectrum in a case where a tensile strain of an $In_{0.45}Ga_{0.55}As$ well layer is introduced. Shown by the broken line is the optical absorption spectrum of an $In_{0.56}Ga_{0.44}As$ well layer whose lattice is matched with that of the InP barrier layer, which is shown for comparison. As can be seen from this figure, in the case of the $In_{0.45}Ga_{0.55}As$ well layer of the optical absorption peak wavelength $\lambda_P$ due to an exciton associated with an electron and a heavy hole in the A region has been shifted to the longer wavelength side in comparison with the A' region of the $In_{0.53}Ga_{0.47}As$ well layer, as well as a sharp peak, though small, is present in the B region in the vicinity of the absorption edge on the more longer wavelength side of the peak wavelength $\lambda_P$. This peak is the optical absorption peak due to an exciton associated with an electron and a light hole. In the case of the $In_{0.45}Ga_{0.55}As$ well layer, the optical absorption peak (the A region) due to an exciton associated with an electron and a heavy hole is present in the short wavelength side of the optical absorption peak (the B region) due to an exciton associated with an electron and a light hole. On the other hand, in the case of the $In_{0.53}Ga_{0.47}As$ well layer, the optical absorption peak (the A' region) due to an exciton associated with an electron and a heavy hole is present in the long wavelength side of the optical absorption peak (the B' region) due to an exciton associated with an electron and a light hole. That is, as the result of the introduction of tensile strain to the $In_{1-x}Ga_xAs$ well layer, the position of the absorption peak A due to an exciton associated with an electron and a heavy hole is interchanged with the position of the absorption peak B due to an exciton associated with an electron and a light hole.

As a result, in the case of the $In_{0.45}Ga_{0.55}As$ well layer, an absorption coefficient in a low-absorption region in the shorter wavelength than the optical absorption peak wavelength $\lambda_P$ of an exciton associated with an electron and a heavy hole in the A section is smaller than an optical absorption coefficient in a corresponding low-absorption region of the $In_{0.53}Ga_{0.47}As$ well layer. Therefore, in the case of the $In_{0.45}Ga_{0.55}As$ well layer, the ratio of an optical absorption coefficient in the peak wavelength $\lambda_P$ to that in the low-absorption region of the short wavelength side is greater than in the case of the $In_{0.53}Ga_{0.47}As$ well layer.

Figure 12:
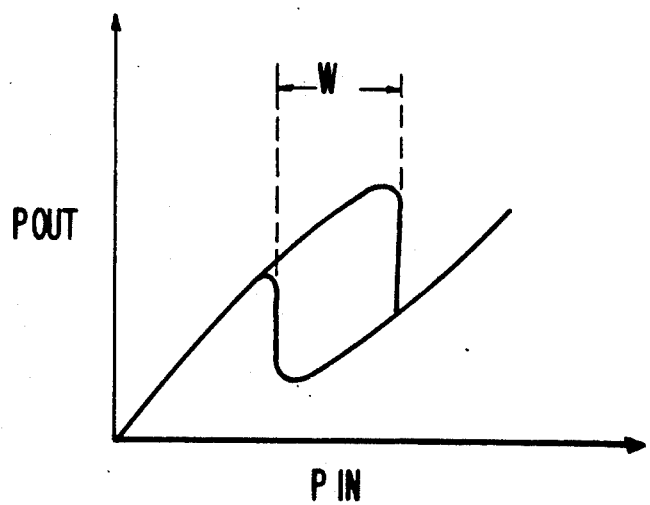
FIG. 12 is a graph for explaining the bistable characteristics of the SEED of FIG. 10.

FIG. 12 is a graph for explaining the bistable characteristics of the above-mentioned SEED, in which the optical bistable characteristics between an incident beam power (PIN) and an emission beam power ($P_{OUT}$) are shown. In the case of the $In_{0.45}Ga_{0.55}As$ well layer, the width (W) of this bistable area is larger than has previously been, since the ratio of the optical absorption coefficient at the peak wavelength $\lambda_P$ to the optical absorption coefficient in the low-absorption region of the short wavelength side is greater than in the case of the $In_{0.53}Ga_{0.47}As$ well layer. Consequently, an optical bistable operation can be performed stably.

In the first and second embodiments, a case where an MQW active layer in which an $In_{1-x}Ga_xAs$ well layer and an InP barrier layer are alternately laminated is described. The same advantage as above can be obtained by the use of an MQW active layer in which an $In_{1-x}Ga_xAs_{1-y}P_y$ well layer and an InP barrier layer are alternately laminated. The values of x in ternary compounds, $In_{1-x}Ga_xAs$ and $In_{1-x}Al_xAs$ are between 0.35 and 0.6.

The x and y in a quaternary compound, $In_{1-x}Ga_xAs$ and $In_{1-x}Al_xAs$ are between 0.35 and 0.6

The x and y in a quaternary compound, $In_{1-x}Ga_xAs_yP_{1-y}$, are determined respectively, so that the difference between the lattice constant of the $In_{1-x}Ga_xAs_yP_{1-y}$ calculated by a theoretical formula dna that of InP is smaller than 1% of the lattice constant of InP.

The difference between lattice constant of $In_{1-x}Ga_xAs$ where x is between 0.35 and 0.6 an lattice constant of InP is less than 1% of the lattice constant of InP. Therefore, a MQW stricture comprised of the combination mentioned above has good crystalline qualities. Further, when x is in the range between 0.44 and 0.46, the strongest absorption intensity due to an exciton is observed.

The present invention is not limited to an optical modulator and an optical bistable device. The present invention can also be applied to the other optical semiconductor devices such as optical switches.

Many widely different embodiments of the present invention can be made without departing from the spirit and scope thereof, therefore, it is to be understood that this invention is not limited to the specific embodiments thereof except as defined in the appended claims.

What is claimed is:

1. An optical semiconductor device having a multi-quantum well (MQW) structure in which well layers and barrier layers including different kinds of semiconductor layers are alternatively laminated, said optical semiconductor device comprising:

a barrier layer having a definite lattice constant; and a well layer, connected to said barrier layer and having a lattice constant different from the lattice constant of said barrier layer, wherein an optical absorption intensity due to an exciton produced in said well layer because of lattice strain caused in said well layer is increased and wherein signal light is transmitted when an electric field applied to the MQW is small and the signal lightly is absorbed by spectral shift of an exciton absorption peak in the MQW when the electric field applied to the MQW is large.

2. An optical semiconductor device as claimed in claim 1, wherein said barrier layer is composed of any of indium phosphide (InP), indium aluminum arsenide ($In_{1-x}Al_xAs$) and indium gallium arsenide phosphide ($In_{1-x}Ga_xAs_{1-y}As$) and indium gallium arsenide phosphide ($In_{1-x}Ga_xAs_{1-y}P_y$), and said well layer is composed of any of indium gallium arsenide ($In_{1-x}Ga_xAs$) and indium gallium arsenide phosphide ($In_{1-x}Ga_xAs_{1-y}P_y$).

3. An optical semiconductor device as claimed in claim 2, wherein the composition x of said well layer ranges from 0.3 to 0.60, most preferably 0.44.

4. An optical semiconductor device as claimed in claim 2, wherein the thickness of said indium gallium arsenide ($In_{1-x}Ga_xAs$) is 5 to 15 nm, most preferably approximately 10 nm.

5. An optical semiconductor device as claimed in claim 2, wherein said optical semiconductor device is a modulator in which said MQW structure is interposed between a p-type InP layer and an n-type InP layer.

6. An optical semiconductor device as claimed in claim 3, wherein the thickness of said indium gallium arsenide ($In_{1-x}Ga_xAs$) is 5 to 15 nm, most preferably approximately 10 nm.

7. An optical semiconductor device as claimed in claim 3, wherein said optical semiconductor device is a modulator in which said MQW structure is interposed between a p-type InP layer and an n-type InP layer.

* * * * *

UNITED STATES PATENT AND TRADEMARK OFFICE
CERTIFICATE OF CORRECTION

PATENT NO. : 5,136,602
DATED : August 4, 1992
INVENTOR(S) : Mitsuru Sugawara

It is certified that error appears in the above-identified patent and that said Letters Patent is hereby corrected as shown below:

Column 3, line 37, "will" should be --well--; and line 53, after "a" insert --compressive strain is introduced into the $In_{1-x}Ga_xAs$ well--.

Col. 4, line 55, delete "6".

Col. 7, line 51, "$\eta(=ION/I-$" should be --$\eta(=I_{ON}/I$--; and line 52, "OFF)" should be --$_{OFF})$--, and "Correspondence" should be --correspondence--.

Col. 9, line 24, "(PIN)" should be --$(P_{IN})$;

line 48, "dna" should be --and--;

line 51, "an" should be --and--; and line 53, "stricture" should be --structure--.

UNITED STATES PATENT AND TRADEMARK OFFICE
CERTIFICATE OF CORRECTION

Page 2 of 2

PATENT NO. : 5,136,602
DATED : August 4, 1992
INVENTOR(S) : Mitsuru Sugawara

It is certified that error appears in the above-indentified patent and that said Letters Patent is hereby corrected as shown below:

line 40, "0.3" should be --0.35--.

Signed and Sealed this

Thirtieth Day of November, 1993

*Attest:*

BRUCE LEHMAN

*Attesting Officer*       *Commissioner of Patents and Trademarks*